(12) United States Patent
Booth

(10) Patent No.: US 8,255,779 B2
(45) Date of Patent: Aug. 28, 2012

(54) SYSTEM AND METHOD FOR ACCELERATED FORWARD ERROR CORRECTION (FEC) SYNCHRONIZATION

(75) Inventor: Bradley John Booth, Austin, TX (US)

(73) Assignee: Applied Micro Circuits Corporation, San Diego, CA (US)

( * ) Notice: Subject to any disclaimer, the term of this patent is extended or adjusted under 35 U.S.C. 154(b) by 674 days.

(21) Appl. No.: 12/464,941

(22) Filed: May 13, 2009

(65) Prior Publication Data

US 2010/0293441 A1 Nov. 18, 2010

(51) Int. Cl.
*H03M 13/03* (2006.01)
(52) U.S. Cl. .................. 714/789; 714/784; 714/756
(58) Field of Classification Search .............. 714/789, 714/784, 756, 707
See application file for complete search history.

(56) References Cited

U.S. PATENT DOCUMENTS

| 4,726,029 | A * | 2/1988 | Motley et al. ............ 714/789 |
| 6,643,788 | B1 * | 11/2003 | Butler et al. ............. 713/400 |
| 6,862,325 | B2 * | 3/2005 | Gay-Bellile et al. ....... 375/340 |
| 7,043,160 | B1 * | 5/2006 | Graves ..................... 398/98 |
| 7,206,359 | B2 * | 4/2007 | Kjeldsen et al. .......... 375/316 |
| 7,899,046 | B2 * | 3/2011 | Ver Steeg ................ 370/389 |

* cited by examiner

*Primary Examiner* — Fritz Alphonse
(74) *Attorney, Agent, or Firm* — Law Office of Gerald Maliszewski; Gerald Maliszewski

(57) ABSTRACT

A system and method are provided for accelerating forward error correction (FEC) synchronization in a communicating receiver. On the transmitter side, the method accepts an energy waveform representing a packet of data symbols, encodes the packet, and creates an FEC block. Prior to transmitting the FEC block, an electromagnetic waveform is transmitted representing an FEC flag character. Then, an electromagnetic waveform representing the FEC block is transmitted a predetermined first period of time after the transmission of the FEC flag character. For example, the first time period may be immediately following the FEC flag character transmission or a predetermined number of idle characters following the transmission of the FEC flag character.

24 Claims, 5 Drawing Sheets

SYSTEM AND METHOD FOR ACCELERATED FORWARD ERROR CORRECTION (FEC) SYNCHRONIZATION

BACKGROUND OF THE INVENTION

1. Field of the Invention

This invention generally relates to digital communications and, more particularly, to a system and method for rapidly achieving FEC synchronization through the use of an FEC flag character to mark the arrival of an FEC block.

2. Description of the Related Art

Ethernet messages, either octets of data or control information, are redundantly encoded for the purpose of maintaining DC balance, which is also referred to as running disparity (RD), and ensuring sufficient edge density. 8B/10B is a common RD-encoded format. 8-bit symbols are mapped into 10-bit symbols, coded to provide a sufficient number of state changes to permit clock recovery from the data stream and to ensure DC balance. 8B/10B coding is used in applications such as PCI Express, IEEE 1394b, Fibre Channel, Gigabit Ethernet, InfiniBand, and XAUI to name but a few. 64B/66B is a similar format where 64 symbols are mapped into a 66-bit word. Using a system that controls long-term DC-balance and edge density permits a data stream to be transmitted through a channel with a high-pass characteristic, and to be recovered with conventional clock and data recovery (CDR) units.

More explicitly, 64B/66B is encoded with 2 extra bits per 64 data bits, to detect the start of a 66-bit block. Two bits are used to provide a sufficiently unique value to find the start of a block. To maintain DC balance the value is either 10 or 01. 01 indicates that the block is data, and 10 indicates that the block is control. In addition to 64B/66B coding, Ethernet messages are typically encoded for FEC. FEC encoding creates parity information appended to the data, which is used to correct errors.

In accordance with IEEE Std. 802.3ap, a training pattern is run to help set the equalizers in the PHY, and then the FEC decoder searches for synchronization. The FEC is self-synchronizing and synchronization is not asserted until no errors are found. More explicitly, a typical FEC sync operation initially indicates that the FEC is out of sync, starts the capture of data, and performs error detection. Once a predetermined number of FEC blocks are received without errors, FEC synchronization is asserted. The FEC code that is used can take up to 446 microseconds to achieve synchronization.

In the case of the energy-efficient Ethernet being proposed in IEEE 802.3az, this long synchronization time would degrade performance as a device transitions from start-up in a low-power idle state to a full operational state. The FEC is shut off between communications to save power. The energy efficient Ethernet has a limited wake window that cannot tolerate a 446 microsecond synchronization time. Rather, the wake window must be in the order of 10B of microseconds.

It would be advantageous if an FEC encoded Ethernet data stream could be synchronized upon start-up in less than 100 microseconds.

SUMMARY OF THE INVENTION

The invention disclosed herein resolves the above-mentioned problems by using a message to indicate a last training frame or otherwise permit a known boundary condition to be communicated; thereby permitting the FEC to achieve rapid synchronization (e.g., immediately upon exiting training).

Accordingly, a method is provided for accelerating forward error correction (FEC) synchronization in a communicating receiver. The method accepts an energy waveform representing a packet of data symbols, encodes the packet, and creates an FEC block. Prior to transmitting the FEC block, an electromagnetic waveform is transmitted representing an FEC flag character. Then, an electromagnetic waveform representing the FEC block is transmitted a predetermined first period of time after the transmission of the FEC flag character. For example, the first time period may be immediately following the FEC flag character transmission or a predetermined number of idle characters following the transmission of the FEC flag character.

A method is also provided for accelerating FEC synchronization in a receiver. The method accepts an energy waveform representing an FEC flag character. A predetermined first period of time subsequent to accepting the FEC flag character, an energy waveform representing an FEC block is accepted. In response to the first time period, the process of decoding the FEC block is begun and FEC synchronization is asserted. An encoded packet of data symbols is decoded to create encoded data symbols. After decoding the data symbols, an electromagnetic waveform is supplied representing a packet of decoded data symbols.

Additional details of the above-described methods, and systems for accelerating FEC synchronization, are provided below.

DETAILED DESCRIPTION

Figure 1:
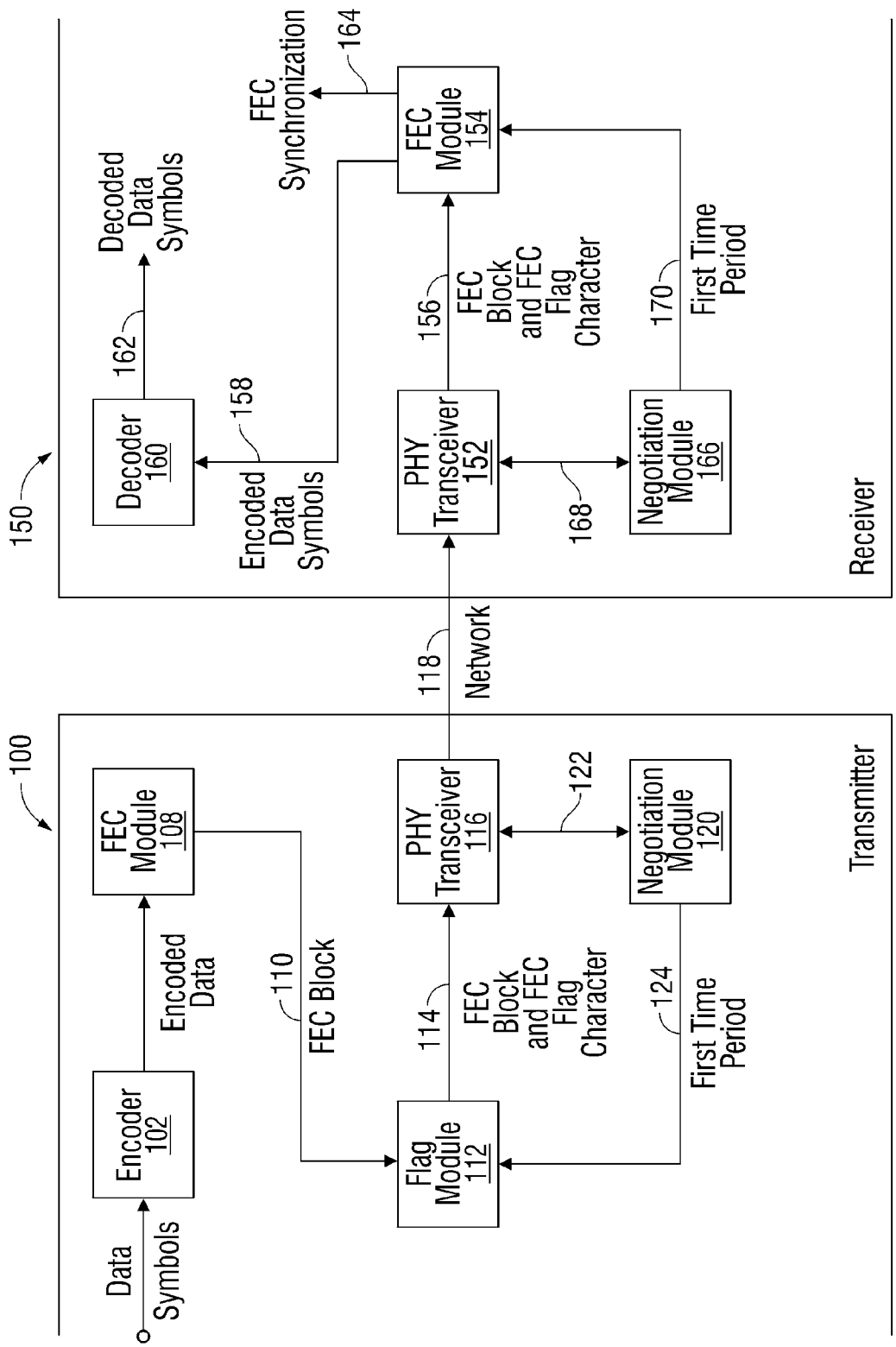
FIG. 1 is a schematic block diagram of a transmitter with a system for accelerating forward error correction (FEC) synchronization in a communicating receiver.

FIG. 1 is a schematic block diagram of a transmitter with a system for accelerating forward error correction (FEC) synchronization in a communicating receiver. The system 100 comprises an encoder 102 having an input on line 104 for accepting an energy waveform representing a packet of data symbols. For example, line 104 may be connected to an upper level (e.g., a media access control (MAC) level) device (not shown). The encoder 102 has an output on line 106 to supply a packet of encoded data symbols. An FEC module 108 has an input on line 106 to accept the encoded data symbols and an output on line 110 to supply an FEC block.

A flag module 112 has an input on line 110 to accept the FEC block and an output on line 114 to supply an FEC flag character inserted a predetermined first period of time before the FEC block. A physical medium (PHY) transceiver 116 has an input connected to the flag module output on line 114, and a network-connected output on line 118 to transmit an electromagnetic waveform representing the FEC block. The FEC block is transmitted the first period of time after the transmission of the FEC flag character. In one aspect, the physical medium transceiver 116 transmits the FEC block in accordance with an IEEE 802.3az protocol.

Figure 2A:
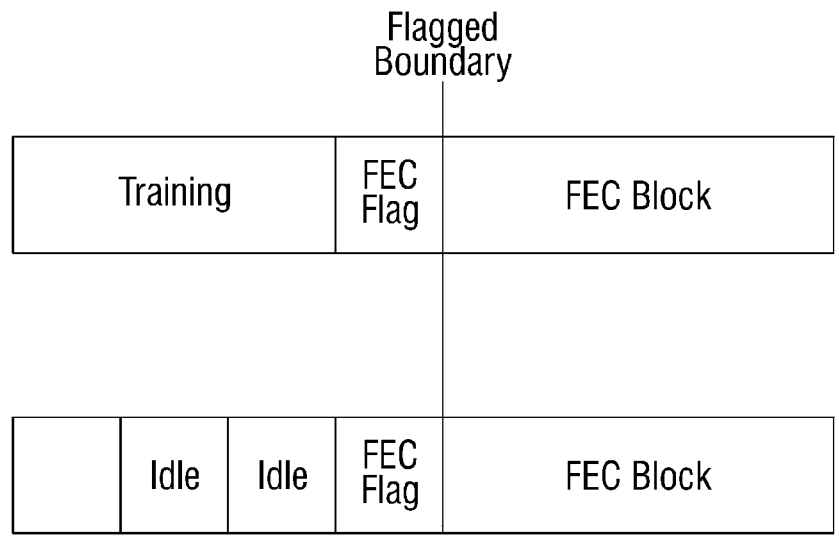
FIGS. 2A and 2B are FEC block boundary diagrams.
Figure 2B:
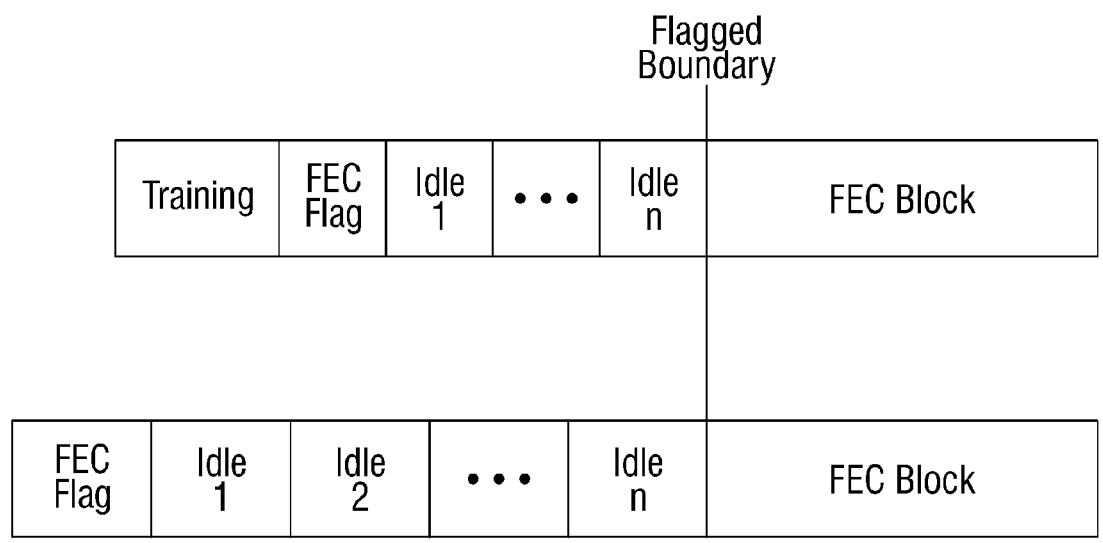

FIGS. 2A and 2B are FEC block boundary diagrams. In FIG. 2A, the flag module has inserted the FEC flag character immediately before the FEC block, so that the first time period is equal to zero. In FIG. 2B the FEC flag character is inserted n number of idle characters before the FEC block, where n is a variable not limited to any particular value. In other words, the first time period is equal to the duration of n idle characters. In either case, the first time period is a predefined value that has been mutually agreed upon by a communicating transmitter and receiver. Note: the term, idle, character is being used to denote a control or overhead character with a known duration, and the system is not dependent upon any particular type of character.

Returning to FIG. 1, in one aspect the system 100 further comprises a negotiation module 120 having an interface on line 122 connected to the physical medium transceiver 116 for enabling an auto-negotiation (AN) process prior to the transmission of the FEC flag character. An interface on line 124 is connected to the flag module 112 to supply the first time period determined in response to the AN process performed with a communicating receiver.

Some units are able to send AN pages, compliant with Clause 73 of 802.3ap, to negotiate a data rate, and these AN pages can be modified to additionally communicate FEC flag information. Typically, the AN pages are called following power-up, reset, link fault, or a time-out. Alternately, the transmitter is configured with the first time period value or derived as a result of training, and the AN process is not required.

Figure 3:
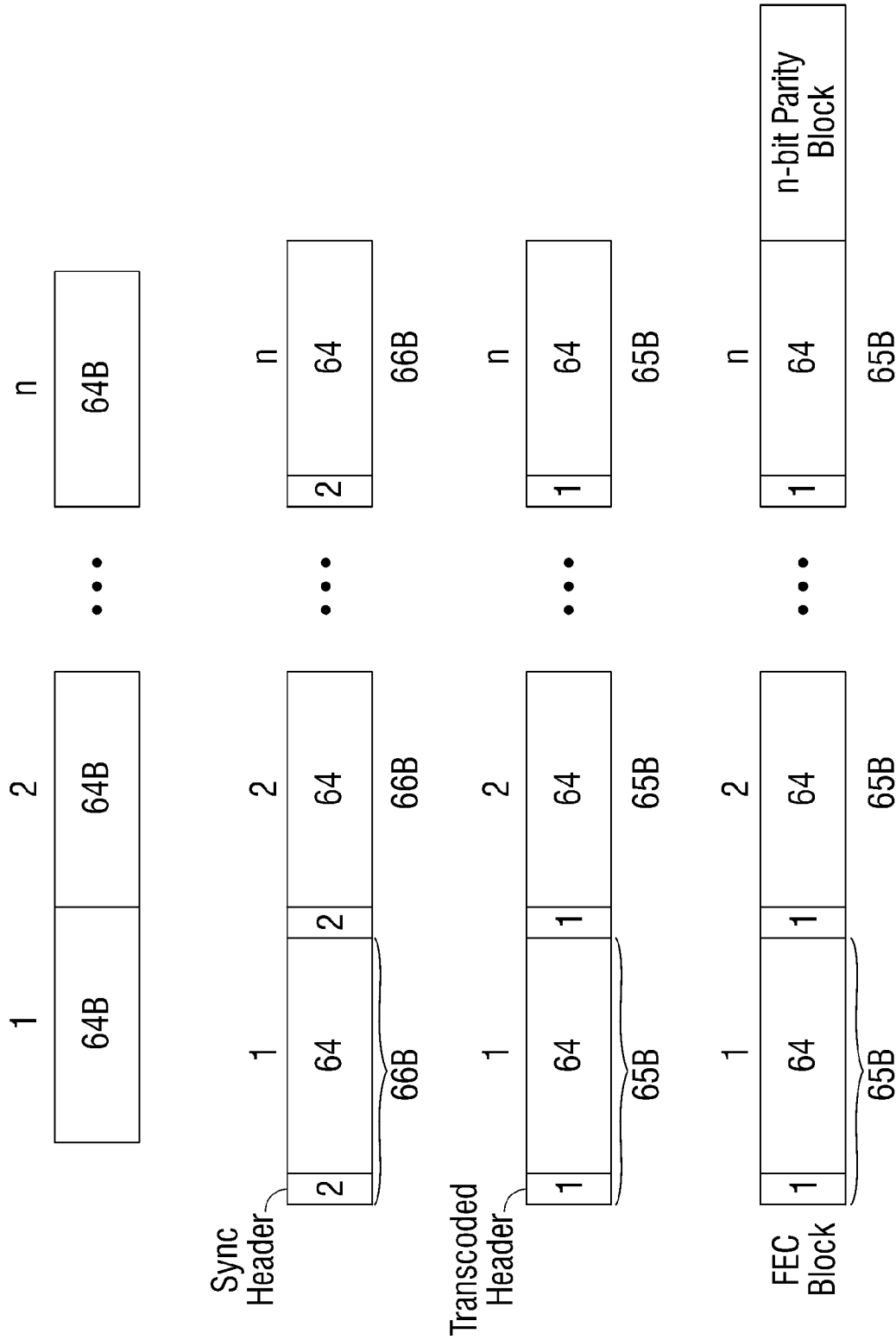
FIG. 3 is a signal diagram depicting the encoding process.

FIG. 3 is a signal diagram depicting the encoding process. The encoder segments the incoming data in to n blocks of 64 bits (B) and creates n 64B/66B blocks, each with 2-bit sync header. Then, each sync header is compressed, creating n 65B blocks with a one-bit transcoded header. Finally, the FEC module supplies an FEC block with n 65B encoded blocks and an n-bit parity block. By transcoding, the n parity bits are created without adding additional overhead Returning to FIG. 1, a receiver is also depicted with a system for accelerating FEC synchronization. The system 150 comprises a physical medium transceiver 152 having a network-connected interface on line 118 for accepting an energy waveform representing an FEC flag character, followed a predetermined first period of time by an FEC block (see FIGS. 2A and 2B).

An FEC module 154 having an input on line 156 is connected to the physical medium transceiver 152. The FEC module 154 begins decoding of the FEC block the first period of time after the receipt of the FEC flag character, and supplies a packet of encoded data symbols at an output on line 158. In one aspect, the FEC module 154 accepts an FEC block in accordance with an IEEE 802.3az protocol. A decoder 160 has an input on line 158 to accept the packet of encoded data symbols and an output on line 162 to supply an electromagnetic waveform representing a packet of decoded data symbols. For example, line 162 may be connected to an upper level MAC device (not shown).

The FEC module 154 begins decoding the FEC block a first time period after the receipt of the FEC flag character, where the first time period either immediately follows the FEC flag character or is n number of idle characters after the receipt of the FEC flag character. The FEC module initially asserts an FEC synchronization signal on line 164 upon receipt of the FEC block, and asserts an out-of-synchronization signal on line 164 in response to detecting a predetermined first number of uncorrectable errors. In one aspect, the FEC module 154 asserts FEC synchronization less than 100 microseconds after accepting the FEC block.

In another aspect, the system 150 further comprises a negotiation module 166 having an interface on line 168 connected to the physical medium transceiver 152 for enabling an AN process prior to the receipt of the FEC flag character. The negotiation module 166 has an interface connected to the FEC module on line 170 to supply the first time period determined in response to the AN process that is conducted with system 100. Alternately, the first time period may be reconfigured or derived as a result of the training process.

The receiver decoding process is essentially the reverse of the encoding process shown in FIG. 3. The FEC module 154 uses a received n-bit parity block to correct n 65B blocks, each with a one-bit transcoded header. The decoder 160 decompresses the n 65B blocks, creating n 64B/66B blocks, each with 2-bit sync header, and transforms the n 64/66B blocks into decoded data symbols.

FIG. 1 and the explanation above imply a one-way link from the transmitter to the receiver. However, it should be understood that both units have a PHY transceiver, and that two-way links are typical. In other words, both ends of the link may transmit FEC blocks preceded by FEC flag characters.

The systems and modules depicted in FIG. 1 can be enabled in hardware as analog circuitry, memories, state logic machines, and combinational logic. However, portions of some of the modules may alternately be enabled as a software application of processor instructions that are stored in memory and executed by a processor (not shown).

Functional Description

The wake (first time period) has predetermined timing boundaries for transitioning from wake to active idle. Both the transmitter and receiver are aware of the boundary. The FEC boundary is flagged using a predetermined message (flag character) to indicate the start of the FEC block. The FEC flag character can be embedded in a training frame or in a 64B/66B frame. The transmitter flags the boundary, and then transitions to FEC encoded data at the predetermined time. The receiver detects the flag, and then captures the FEC encoded data at the predetermined time.

As is well understood in the art, FEC encoding is a process that adds redundant data to a message, known as an error correction code, which is referred to herein as the parity block. This parity data permits the receiver to detect and correct a limited number of errors. While FEC encoding requires extra processing and overhead, it eliminates the need for a back channel and reduces the number data retransmissions.

FEC devices are often located in the first stage of digital processing after a signal has been received. Thus, FEC circuits are often an integral part of the analog-to-digital conversion process, modulation, and coding. Many FEC coders can also generate a bit-error rate (BER) signal which can be used as feedback to fine-tune the analog receiving electronics.

Conventional FEC synchronization operations initially indicate that the FEC is out of sync, start the capture of data, and then perform error detection. Once a predetermined number of FEC blocks are received without errors, FEC synchronization is asserted. In contrast, the system of FIG. 1 initially indicates that the FEC is in sync, starts the capture of FEC data at flagged boundary, and performs error detection. FEC synchronization remains asserted unless a predefined number of uncorrectable errors are detected. If uncorrectable errors are detected, the system transitions to a conventional FEC sync operation, and synchronization is not reasserted until a predetermined number of FEC blocks are received without errors.

IEEE 802.3 Clause 74 declares that the FEC may not add overhead by providing sync bits. Therefore, when the FEC first starts running, it must first search for a sequence of data with either no errors or correctable errors. Subclause 74.7.4.7 explains FEC block synchronization. Once the FEC block has found sync, it stops searching for the FEC block location and just performs error correction.

Conventional FEC operations can take a long time to assert synchronization due to the length of the sequences associated with the scrambler polynomial. However, if the start of the FEC block is known, then is no need to search for the FEC block, which greatly reduces the overall synchronization time.

Figure 4:
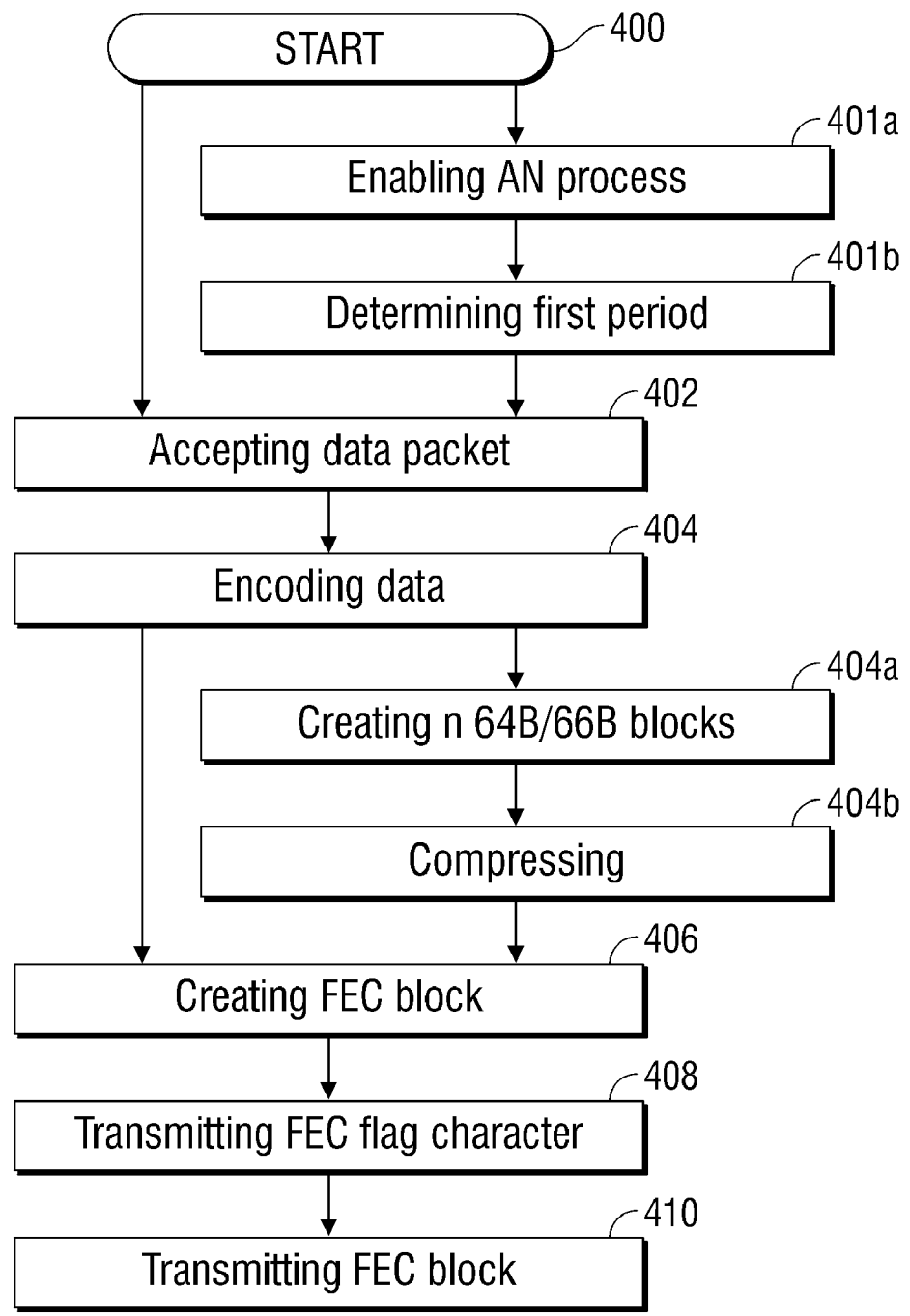
FIG. 4 is a flowchart illustrating a method for accelerating FEC synchronization in a transmitter communicating with a receiver.

FIG. 4 is a flowchart illustrating a method for accelerating FEC synchronization in a transmitter communicating with a receiver. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 400.

Step 402 accepts an energy waveform representing a packet of data symbols. Step 404 encodes the packet of data symbols. Step 406 creates an FEC block. Prior to transmitting the FEC block, Step 408 transmits an electromagnetic waveform representing an FEC flag character. Step 410 transmits an electromagnetic waveform representing the FEC block a predetermined first period of time after the transmission of the FEC flag character. The predetermined first period of time may be immediately following the FEC flag character transmission or a first number of idle characters following the transmission of the FEC flag character. In one aspect, transmitting the FEC block in Step 410 includes transmitting an FEC block in accordance with an IEEE 802.3az protocol.

It is understood that the transmission, manipulation, and receipt of energy waveforms representing electrical signal are a transformation of matter, since these waveforms can be understood as a flow of electrons, which are physical elements.

In another aspect prior to transmitting the FEC flag character, Step 401a enables an auto-negotiation (AN) process. In response to the AN process, Step 401b determines the first time period. In one aspect, encoding the packet in Step 404 includes substeps. Step 404a creates n 64B/66B blocks, each with 2-bit sync header. Step 404b compresses each sync header, creating n 65B blocks with a one-bit transcoded header. Then, creating the FEC block in Step 406 includes encoding the n 65B blocks and adding an n-bit parity block.

Figure 5:
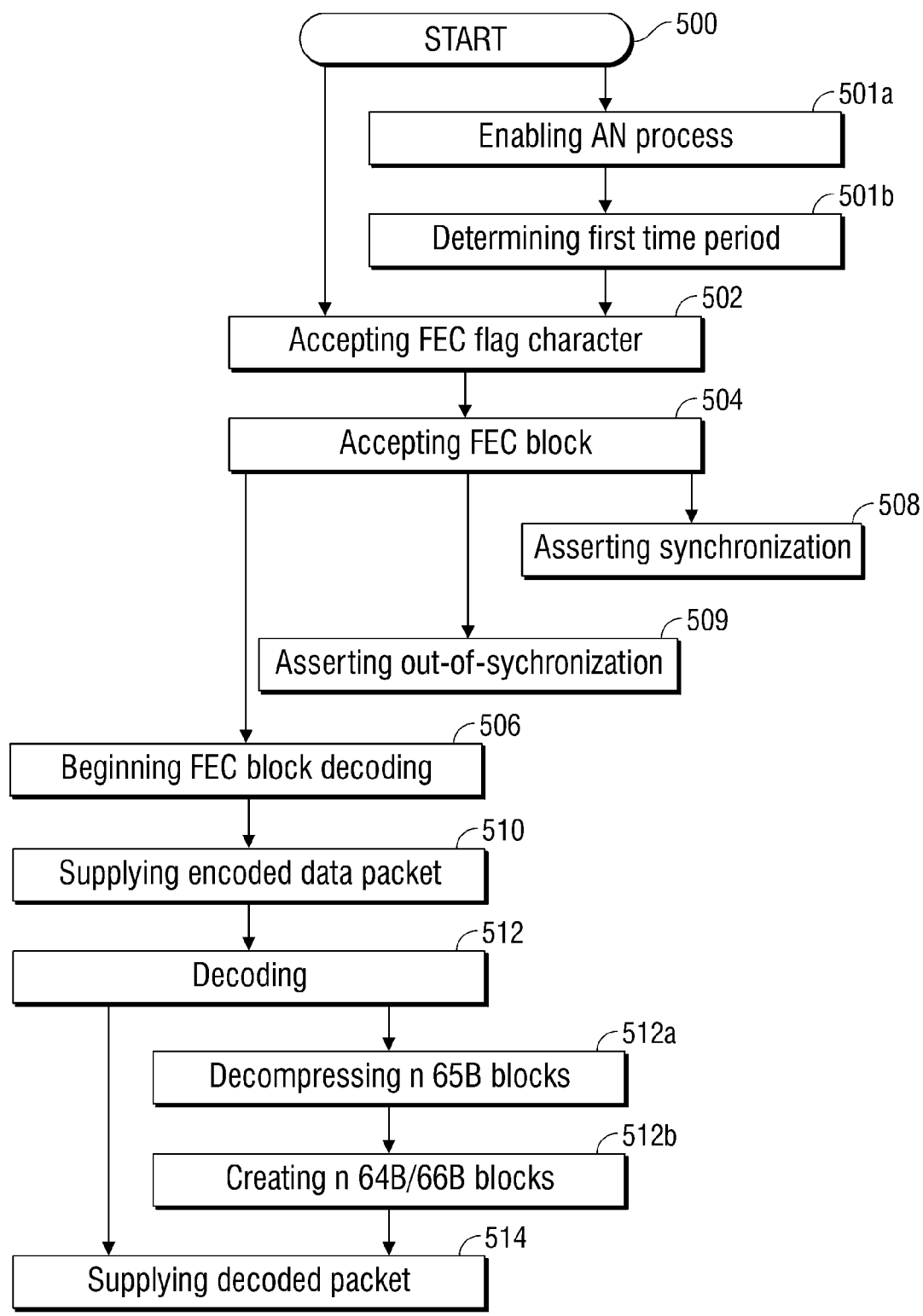
FIG. 5 is a flowchart illustrating a method for accelerating FEC synchronization in a receiver.

FIG. 5 is a flowchart illustrating a method for accelerating FEC synchronization in a receiver. The method starts with Step 500. Step 502 accepts an energy waveform representing an FEC flag character. A predetermined first period of time subsequent to accepting the FEC flag character, Step 504 accepts an energy waveform representing an FEC block. In one aspect, Step 504 accepts the FEC block in accordance with an IEEE 802.3az protocol. As noted above, the first time period can be defined as immediately following the FEC flag character or a first number of idle characters following the receipt of the FEC flag character.

In response to the first time period, Step 506 begins the process of decoding the FEC block. Step 508 asserts FEC synchronization. Typically, Steps 506 and 508 occur almost simultaneously. Step 510 supplies an encoded packet of data symbols. Step 512 decodes the packet of encoded data symbols, and Step 514 supplies an electromagnetic waveform representing a packet of decoded data symbols.

In one aspect prior to accepting the FEC flag character, Step 501a enables an auto-negotiation (AN) process. In response to the AN process, Step 501b determines the first time period.

In another aspect, supplying the packet of encoded data symbols in Step 510 includes using a received n-bit parity block to correct n 65B blocks with a one-bit transcoded header. Then, decoding the packet of encoded data symbols in Step 512 includes substeps. Step 512a decompresses the n 65B blocks, creating n 64B/66B blocks, each with 2-bit sync header. Step 512b transforms the 64B/66B blocks to decoded data symbols.

In another aspect, asserting FEC synchronization in Step 508 includes initially asserting FEC synchronization upon receipt of the FEC block. Typically, FEC synchronization is asserted in less than 100 microseconds after accepting the FEC block. Step 509 asserts an out-of-synchronization signal in response to detecting a predetermined first number of uncorrectable errors.

Systems and methods have been provided for accelerating FEC synchronization. The invention has been illustrated in the context of 64B/66B words, and the IEEE 802.3az and Ethernet protocols. However, the invention is not limited to merely these examples. Other variations and embodiments of the invention will occur to those skilled in the art.

I claim:

1. In a transmitter, a method for accelerating forward error correction (FEC) synchronization in a communicating receiver, the method comprising:
   accepting an energy waveform representing a packet of data symbols;
   encoding the packet of data symbols;
   creating an FEC block that permits a predetermined number of errors to be corrected it the packet of encoded data symbols;
   prior to transmitting the FEC block, transmitting an electromagnetic waveform representing an FEC flag character indicating the start of the FEC block; and,
   transmitting an electromagnetic waveform representing the FEC block a predetermined first period of time after the transmission of the FEC flag character.

2. The method of claim 1 wherein transmitting the FEC block the predetermined first period of time after the transmission of the FEC flag character includes transmitting at a first time period selected from a group consisting of immediately following the FEC flag character transmission and a first number of idle characters following the transmission of the FEC flag character.

3. The method of claim 1 further comprising:
   prior transmitting the FEC flag character, enabling an auto-negotiation (AN) process; and,
   in response to the AN process, determining the first time period.

4. The method of claim 1 wherein encoding the packet includes:
   creating n 64B/66B blocks, each with 2-bit sync header;
   compressing each sync header, creating 65B blocks with a one-bit transcoded header; and,
   wherein creating the FEC block includes encoding the n 65B blocks and adding an n-bit parity block.

5. The method of claim 4 wherein transmitting the FEC block includes transmitting an FEC block in accordance with an IEEE 802.3az protocol.

6. In a receiver, a method for accelerating forward error correction TEC synchronization, the method comprising:
   accepting an energy waveform representing an FEC flag character indicating the start of an FEC block, where the FEC block permits a predetermined number of errors to be corrected in a packet of encoded data symbols;

a predetermined first period of time subsequent to accepting the FEC flag character, accepting an energy waveform representing the FEC block;
in response to the first time period, beginning the process of decoding the FEC block;
asserting FEC synchronization;
supplying an encoded packet of data symbols;
decoding the packet of encoded data symbols; and,
supplying an electromagnetic waveform representing a packet of decoded data symbols.

7. The method of claim 6 wherein accepting the FEC block the predetermined first period of time after accepting the FEC flag character includes accepting after a first time period selected from a group consisting of immediately following the FEC flag character and a first number of idle characters following the receipt of the FEC flag character.

8. The method of claim 6 further comprising:
prior accepting the FEC flag character, enabling an auto-negotiation (AN) process; and,
in response to the AN process, determining the first time period.

9. The method of claim 6 wherein supplying the packet of encoded data symbols includes using a received n-bit parity block to correct n 65B blocks with a one-bit transcoded header; and,
wherein decoding the packet of encoded data symbols includes:
decompressing the n 65B blocks, creating n 64B/66B blocks, each with 2-bit sync header; and,
transforming the 64/66B blocks to decoded data symbols.

10. The method of claim 9 wherein, accepting the FEC block includes accepting an FEC block in accordance with an IEEE 802.3az protocol.

11. The method of claim 6 wherein asserting FEC synchronization includes initially asserting FEC synchronization upon receipt of the FEC block; and,
the method further comprising:
asserting an out-of-synchronization signal in response to detecting a predetermined first number of uncorrectable errors.

12. The method of claim 11 wherein asserting FEC synchronization includes asserting FEC synchronization less than 100 microseconds after accepting the FEC block.

13. In a transmitter, a system for accelerating forward error correction (FEC) synchronization in a communicating receiver, the system comprising:
an encoder having an input for accepting an energy waveform representing a packet of data symbols and an output to supply a packet of encoded data symbols;
an FEC module having an input to accept the packet of encoded data symbols and an output to supply an FEC block that permits a predetermined number of errors to be corrected in the packet of encoded data symbols;
a flag module having an input to accept the FEC block and an output to supply an FEC flag character inserted a predetermined first period of time before the FEC block, where the FEC flag character indicates the start of the FEC block; and,
a physical medium transceiver having an input connected to the flag module output and a network-connected output to transmit an electromagnetic waveform representing the FEC block, the first period of time after the transmission of the FEC flag character.

14. The system of claim 13 wherein the flag module inserts the FEC flag character before the FEC block, where the first time period is selected from a group consisting of immediately before the FEC block and a first number of idle characters before the FEC block.

15. The system of claim 13 further comprising:
a negotiation module having an interface connected to the physical medium transceiver for enabling an auto-negotiation (AN) process prior to the transmission of the FEC flag character, and an interface connected to the flag module to supply the first time period determined in response to the AN process.

16. The system of claim 13 wherein the encoder: creates n 64B/66B blocks, each with 2-bit sync header, compresses each sync header, creating n 65B blocks with a one-bit transcoded header; and,
wherein the FEC module supplies an FEC block with n 65B encoded blocks with an n-bit parity block.

17. The system of claim 16 wherein the physical medium transceiver transmits the FEC block in accordance with an IEEE 802.3az protocol.

18. In a receiver, a system for accelerating forward error correction (FEC) synchronization, the system comprising:
a physical medium transceiver having a network-connected interface for accepting an energy waveform representing an FEC flag character that indicates the start of an FEC block, followed, a predetermined first period of time by the FEC block that permits a predetermined number of errors to be corrected in a packet of encoded data symbols;
an FEC module having an input connected to the physical medium transceiver, the FEC module beginning decoding of the FEC block the first period of time after the receipt of the FEC flag character, and supplying the packet of encoded data symbols at an output; and,
a decoder having an input to accept the packet of encoded data symbols and an output to supply an electromagnetic waveform representing a packet of decoded data symbols.

19. The system of claim 18 wherein the FEC module begins decoding the FEC block a first time period selected from a group consisting of immediately following the FEC flag character and a first number of idle characters following the receipt of the FEC flag character.

20. The system of claim 18 further comprising:
a negotiation module having an interface connected to the physical medium transceiver for enabling an auto-negotiation (AN) process prior to the receipt of the FEC flag character, and an interface connected to the FEC module to supply the first time period determined in response to the AN process.

21. The system of claim 18 wherein the FEC module uses a received n-bit parity block to correct n 65B blocks with a one-bit transcoded header; and,
wherein, the decoder decompresses the n 65B blocks, creating n 64B/66B blocks, each with 2-bit sync header, and transforms the n 64/66B blocks into decoded data symbols.

22. The system of claim 21 wherein the FEC module accepts an FEC block in accordance with an IEEE 802.3az protocol.

23. The system of claim 21 wherein the FEC module initially asserts an FEC synchronization signal upon receipt of the FEC block, and asserts an out-of-synchronization signal in response to detecting a predetermined first number of uncorrectable errors.

24. The system of claim 23 wherein the FEC module asserts FEC synchronization less than 100 microseconds after accepting the FEC block.

* * * * *